United States Patent
Sonobe et al.

(10) Patent No.: US 12,113,088 B2
(45) Date of Patent: Oct. 8, 2024

(54) LIGHT DETECTION DEVICE

(71) Applicant: HAMAMATSU PHOTONICS K.K., Hamamatsu (JP)

(72) Inventors: Hironori Sonobe, Hamamatsu (JP); Fumitaka Nishio, Hamamatsu (JP); Yuji Okazaki, Hamamatsu (JP); Kazuaki Maekita, Hamamatsu (JP)

(73) Assignee: HAMAMATSU PHOTONICS K.K., Hamamatsu (JP)

( * ) Notice: Subject to any disclaimer, the term of this patent is extended or adjusted under 35 U.S.C. 154(b) by 541 days.

(21) Appl. No.: 17/311,838

(22) PCT Filed: Nov. 29, 2019

(86) PCT No.: PCT/JP2019/046880
§ 371 (c)(1),
(2) Date: Jun. 8, 2021

(87) PCT Pub. No.: WO2020/121851
PCT Pub. Date: Jun. 18, 2020

(65) Prior Publication Data
US 2022/0020806 A1    Jan. 20, 2022

(30) Foreign Application Priority Data

Dec. 12, 2018 (JP) ................................. 2018-232892
Dec. 12, 2018 (JP) ................................. 2018-232895
Jun. 14, 2019 (JP) ................................. 2019-111528

(51) Int. Cl.
*H01L 27/146* (2006.01)
*G01J 1/44* (2006.01)
*H01L 31/107* (2006.01)

(52) U.S. Cl.
CPC .......... *H01L 27/14636* (2013.01); *G01J 1/44* (2013.01); *H01L 31/107* (2013.01); *G01J 2001/4466* (2013.01)

(58) Field of Classification Search
CPC ............. H01L 31/107; H01L 31/02027; H01L 27/14643; H01L 27/14636; G01J 1/44
See application file for complete search history.

(56) References Cited

U.S. PATENT DOCUMENTS 4,181,863 A    1/1980  Parker
4,247,186 A    1/1981  Uchidoi et al.
(Continued)

FOREIGN PATENT DOCUMENTS

CN    1516362 A      7/2004
CN    200950235 A    9/2007
(Continued)

OTHER PUBLICATIONS

International Preliminary Report on Patentability mailed Jun. 24, 2021 for PCT/JP2019/046909.
(Continued)

*Primary Examiner* — John A Bodnar
(74) *Attorney, Agent, or Firm* — Faegre Drinker Biddle & Reath LLP (57) ABSTRACT

In a light detection device, the semiconductor substrate has first and second main surfaces facing each other. The semiconductor substrate includes a plurality of cells. Each of the plurality of cells includes at least one avalanche photodiode. The plurality of pad electrodes are arranged on the first main surface so as to be spaced apart from the plurality of cells. The plurality of wiring portions are arranged on the first main surface. Each of the plurality of wiring portions connects the cell and the pad electrode corresponding to each other. The semiconductor substrate includes a periph-
(Continued)

eral carrier absorbing portion configured to absorb carriers located at a periphery of the peripheral carrier absorbing portion. The peripheral carrier absorbing portion is provided around each pad electrode and each wiring portion when viewed from a direction perpendicular to the first main surface.

25 Claims, 6 Drawing Sheets

(56) References Cited

U.S. PATENT DOCUMENTS

| | | | |
|---|---|---|---|
| 4,292,514 A | 9/1981 | Ohtomo | |
| 4,464,048 A | 8/1984 | Farlow | |
| 4,948,989 A | 8/1990 | Spratt | |
| 5,548,112 A | 8/1996 | Nakase et al. | |
| 5,578,815 A | 11/1996 | Nakase et al. | |
| 6,313,459 B1 | 11/2001 | Hoffe et al. | |
| 6,504,140 B1 * | 1/2003 | Ueno | H01L 27/14627 250/214 R |
| 8,350,351 B2 | 1/2013 | Koyama | |
| 9,954,124 B1 | 4/2018 | Kuznetsov | |
| 10,064,585 B2 | 9/2018 | Kimura et al. | |
| 11,513,002 B2 | 11/2022 | Sonobe et al. | |
| 2003/0117121 A1 | 6/2003 | Prescott | |
| 2005/0092896 A1 | 5/2005 | Ichino | |
| 2008/0138092 A1 | 6/2008 | Nagakubo | |
| 2012/0101614 A1 | 4/2012 | Ghaemi et al. | |
| 2015/0177394 A1 | 6/2015 | Dolinsky et al. | |
| 2016/0084964 A1 | 3/2016 | Kimura et al. | |
| 2016/0273959 A1 | 9/2016 | Wang | |
| 2016/0373126 A1 | 12/2016 | Kim et al. | |
| 2017/0031009 A1 | 2/2017 | Davidovic et al. | |
| 2018/0180473 A1 | 6/2018 | Clemens et al. | |
| 2018/0214057 A1 | 8/2018 | Schultz et al. | |
| 2018/0266881 A1 | 9/2018 | Fujiwara et al. | |
| 2021/0134862 A1 | 5/2021 | Ishida et al. | |
| 2022/0020786 A1 | 1/2022 | Sonobe | |
| 2022/0020806 A1 | 1/2022 | Sonobe et al. | |
| 2022/0026268 A1 | 1/2022 | Sonobe et al. | |
| 2022/0026269 A1 | 1/2022 | Sonobe | |
| 2022/0026270 A1 | 1/2022 | Sonobe | |
| 2022/0037548 A1 | 2/2022 | Sonobe | |
| 2022/0037852 A1 | 2/2022 | Jung et al. | |
| 2022/0246782 A1 | 8/2022 | Inoue et al. | |
| 2023/0083263 A1 | 3/2023 | Fujiwara et al. | |

FOREIGN PATENT DOCUMENTS

| | | |
|---|---|---|
| CN | 200959101 A | 10/2007 |
| CN | 101484999 A | 7/2009 |
| CN | 201601136 U | 10/2010 |
| CN | 103728030 A | 4/2014 |
| CN | 103890972 A | 6/2014 |
| CN | 103907206 A | 7/2014 |
| DE | 102013100696 B3 | 11/2013 |
| EP | 1006591 A2 | 6/2000 |
| EP | 2040308 A1 | 3/2009 |
| EP | 2755235 A1 | 7/2014 |
| GB | 1231906 | 5/1971 |
| GB | 1503088 A | 3/1978 |
| GB | 1532262 | 11/1978 |
| GB | 1535824 | 12/1978 |
| JP | S50-062389 A | 5/1975 |
| JP | S53-041280 A | 4/1978 |
| JP | S55-006924 U | 1/1980 |
| JP | S55-127082 A | 10/1980 |
| JP | S60-178673 A | 9/1985 |
| JP | S60-180347 A | 9/1985 |
| JP | S60-211886 A | 10/1985 |
| JP | S61-038975 U | 3/1986 |
| JP | S61-289677 A | 12/1986 |
| JP | S62-239727 A | 10/1987 |
| JP | S62-279671 A | 12/1987 |
| JP | S64-013768 A | 1/1989 |
| JP | H01-118714 A | 5/1989 |
| JP | H03-021082 A | 1/1991 |
| JP | H03-278482 A | 12/1991 |
| JP | H04-111477 A | 4/1992 |
| JP | H04-256376 A | 9/1992 |
| JP | H05-235396 A | 9/1993 |
| JP | H05-275668 A | 10/1993 |
| JP | H06-224463 A | 8/1994 |
| JP | H07-027607 A | 1/1995 |
| JP | H7-063854 A | 3/1995 |
| JP | H7-263653 A | 10/1995 |
| JP | H08-207281 A | 8/1996 |
| JP | H10-247717 A | 9/1998 |
| JP | H11-275755 A | 10/1999 |
| JP | H11-284445 A | 10/1999 |
| JP | 2002-204149 A | 7/2002 |
| JP | 2004-281488 A | 10/2004 |
| JP | 2004-289206 A | 10/2004 |
| JP | 2004-303878 A | 10/2004 |
| JP | 2004303878 * | 10/2004 |
| JP | 2006-080416 A | 3/2006 |
| JP | 2007-266251 A | 10/2007 |
| JP | 2007-281509 A | 10/2007 |
| JP | 2008-148068 A | 6/2008 |
| JP | 2009-038157 A | 2/2009 |
| JP | 2013-164263 A | 8/2013 |
| JP | 2014-142340 A | 8/2014 |
| JP | 2018-174308 A | 11/2018 |
| SE | 417145 B | 2/1981 |
| TW | 201743459 A | 12/2017 |

OTHER PUBLICATIONS

International Preliminary Report on Patentability mailed Jun. 24, 2021 for PCT/JP2019/046900.

International Preliminary Report on Patentability mailed Jun. 24, 2021 for PCT/JP2019/046901.

International Preliminary Report on Patentability mailed Jun. 24, 2021 for PCT/JP2019/046881.

International Preliminary Report on Patentability mailed Jun. 24, 2021 for PCT/JP2019/046880.

International Preliminary Report on Patentability mailed Jun. 24, 2021 for PCT/JP2019/046907.

International Preliminary Report on Patentability mailed Jun. 24, 2021 for PCT/JP2019/046908.

* cited by examiner

LIGHT DETECTION DEVICE

TECHNICAL FIELD

The present invention relates to a light detection device.

BACKGROUND ART

A known device outputs a signal according to light entering a light receiving portion (for example, Patent Literature 1). The device described in Patent Literature 1 includes a wire electrically connected to the light receiving portion.

CITATION LIST

Patent Literature

Patent Literature 1: Japanese Unexamined Patent Publication No. H5-275668

SUMMARY OF INVENTION

Technical Problem

When a wire is connected around a photodiode in a light detection device whose light receiving portion is configured by a photodiode, stray light due to light reflection on the wire may enter the photodiode directly as well as indirectly. In this case, noise due to the stray light may affect the detection result. In particular, when the amount of light to be detected is large and when the multiplication factor of the photodiode is large, the above noise may appear noticeably.

One aspect of the present invention is to provide a light detection device with improved accuracy of light detection.

Solution to Problem

A light detection device according to one aspect of the present invention includes a semiconductor substrate, a plurality of pad electrodes, and a plurality of wiring portions. The semiconductor substrate has first and second main surfaces facing each other. The semiconductor substrate includes a plurality of cells. Each of the plurality of cells includes at least one avalanche photodiode. The plurality of pad electrodes are arranged on the first main surface so as to be spaced apart from the plurality of cells. The plurality of wiring portions are arranged on the first main surface. Each of the plurality of wiring portions connects the cell and the pad electrode corresponding to each other. The semiconductor substrate includes a peripheral carrier absorbing portion configured to absorb carriers located at a periphery of the peripheral carrier absorbing portion. The peripheral carrier absorbing portion is provided around each of the pad electrodes and each of the wiring portions when viewed from a direction perpendicular to the first main surface.

In the above one aspect, the cells and the pad electrodes corresponding to each other are arranged apart from each other and are connected to each other by the wiring portions. For this reason, it is not likely that the stray light reflected by the wire connected to the pad electrode enters the cell.

Since a relatively high voltage is applied to the avalanche photodiode, the concentration of electrons or holes in a portion of the semiconductor substrate in contact with the pad electrode may change. Similarly, the concentration of electrons or holes in a portion of the semiconductor substrate in contact with the wiring portion may change. In this case, carriers may be generated in the above portion due to the light entering the portion. When carriers are generated in this portion, noise is detected as a detection result. In the above light detection device, the peripheral carrier absorbing portion is provided around each wiring portion. Therefore, even if unnecessary carriers are generated in the above portion, the generated carriers are absorbed by the peripheral carrier absorbing portion. In this light detection device, the accuracy of light detection is improved.

In the above one aspect, the peripheral carrier absorbing portion may continuously surround each of the pad electrodes and each of the wiring portions.

In the above one aspect, the peripheral carrier absorbing portion may intermittently surround each of the pad electrodes and each of the wiring portions.

In the above one aspect, a width of each of the wiring portions may be smaller than a diameter of each of the pad electrodes. In this case, a portion where the semiconductor substrate and the wiring portion are in contact with each other is small. Therefore, it is possible to suppress a change in the concentration of electrons or holes in the semiconductor substrate that occurs due to the voltage applied to the wiring portion.

In the above one aspect, a shortest distance between an edge of each of the cells and an edge of the pad electrode corresponding to the cell may be larger than a diameter of the pad electrode. In this case, it is less likely that the light reflected by the wire connected to the pad electrode enters the cell.

In the above one aspect, a shortest distance between an edge of each of the cells and an edge of the pad electrode corresponding to the cell may be 50 µm or more. In this case, it is less likely that the light reflected by the wire connected to the pad electrode enters the cell.

In the above one aspect, the peripheral carrier absorbing portion may surround each of the wiring portions so that a distance between an edge of the peripheral carrier absorbing portion and an edge of each of the wiring portions is 25 µm to 50 µm. In this case, unnecessary carriers are further absorbed by the peripheral carrier absorbing portion while a short circuit between the peripheral carrier absorbing portion and the wiring portion is further suppressed.

In the above one aspect, a plurality of electrode portions each connected to each of the cells may be further provided. Each of the plurality of wiring portions may be connected to the electrode portion connected to the cell corresponding thereto. A connection portion between an edge of the electrode portion and an edge of the wiring portion may be curved. A radius of curvature of the connection portion may be equal to or greater than a thickness of a depletion layer of the avalanche photodiode in a thickness direction of the semiconductor substrate. In this case, the concentration of the electric field at the above connection portion is suppressed. ESD resistance is also improved.

In the above one aspect, a plurality of electrode portions each connected to each of the cells may be further provided. Each of the plurality of wiring portions may be connected to the electrode portion connected to the cell corresponding thereto. The peripheral carrier absorbing portion may have a curved edge facing a connection portion between an edge of the electrode portion and an edge of the wiring portion when viewed from the direction perpendicular to the first main surface. A radius of curvature of the edge of the peripheral carrier absorbing portion may be equal to or greater than a thickness of a depletion layer of the avalanche photodiode in a thickness direction of the semiconductor substrate. In this case, the concentration of the electric field at the above edge of the peripheral carrier absorbing portion is suppressed. ESD resistance is also improved.

In the above one aspect, a plurality of electrode portions each connected to each of the cells may be further provided. The avalanche photodiode may include a light absorbing region. Each of the plurality of wiring portions may be connected to the electrode portion connected to the cell corresponding thereto. A connection portion between an edge of the electrode portion and an edge of the wiring portion may be curved. A radius of curvature of the connection portion may be equal to or greater than a thickness of the light absorbing region in a thickness direction of the semiconductor substrate. In this case, the concentration of the electric field at the above connection portion is suppressed. ESD resistance is also improved.

In the above one aspect, a plurality of electrode portions each connected to each of the cells may be further provided. The avalanche photodiode may include a light absorbing region. Each of the plurality of wiring portions may be connected to the electrode portion connected to the cell corresponding thereto. The peripheral carrier absorbing portion may have a curved edge facing a connection portion between an edge of the electrode portion and an edge of the wiring portion when viewed from the direction perpendicular to the first main surface. A radius of curvature of the edge of the peripheral carrier absorbing portion may be equal to or greater than a thickness of the light absorbing region in a thickness direction of the semiconductor substrate. In this case, the concentration of the electric field at the above edge of the peripheral carrier absorbing portion is suppressed. ESD resistance is also improved.

In the above one aspect, in the light detection device, the connection portion between the edge of the electrode portion and the edge of the wiring portion may be curved with a radius of curvature of 60 μm to 120 μm. In this case, the concentration of the electric field at the above connection portion is suppressed. ESD resistance is also improved.

In the above one aspect, the edge of the peripheral carrier absorbing portion may be curved with a radius of curvature of 60 μm to 120 μm. In this case, the concentration of the electric field at the above edge of the peripheral carrier absorbing portion is suppressed. ESD resistance is also improved.

In the above one aspect, a plurality of wires each connected to each of the pad electrodes may be further provided. A ball bond of the wire may be bonded to each of the pad electrodes. In this case, the size of the pad electrode can be reduced, and damage caused to the semiconductor substrate in wire bonding is reduced.

Advantageous Effects of Invention

One aspect of the present invention can provide a light detection device with improved accuracy of light detection.

DESCRIPTION OF EMBODIMENTS

Hereinafter, embodiments of the present invention will be described in detail with reference to the accompanying diagrams. In addition, in the description, the same elements or elements having the same function are denoted by the same reference numerals, and repeated descriptions thereof will be omitted.

Figure 1:
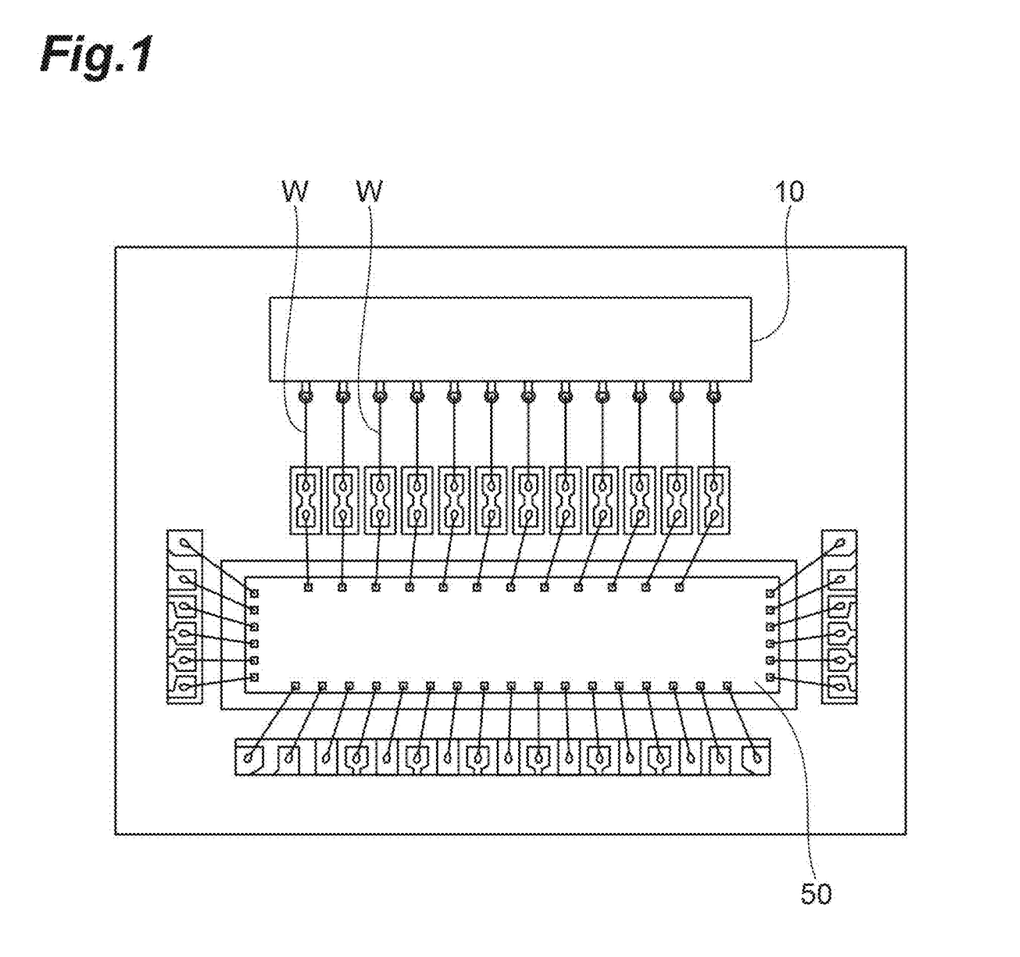
FIG. 1 is a plan view of a light detection device according to the present embodiment.
Figure 2:
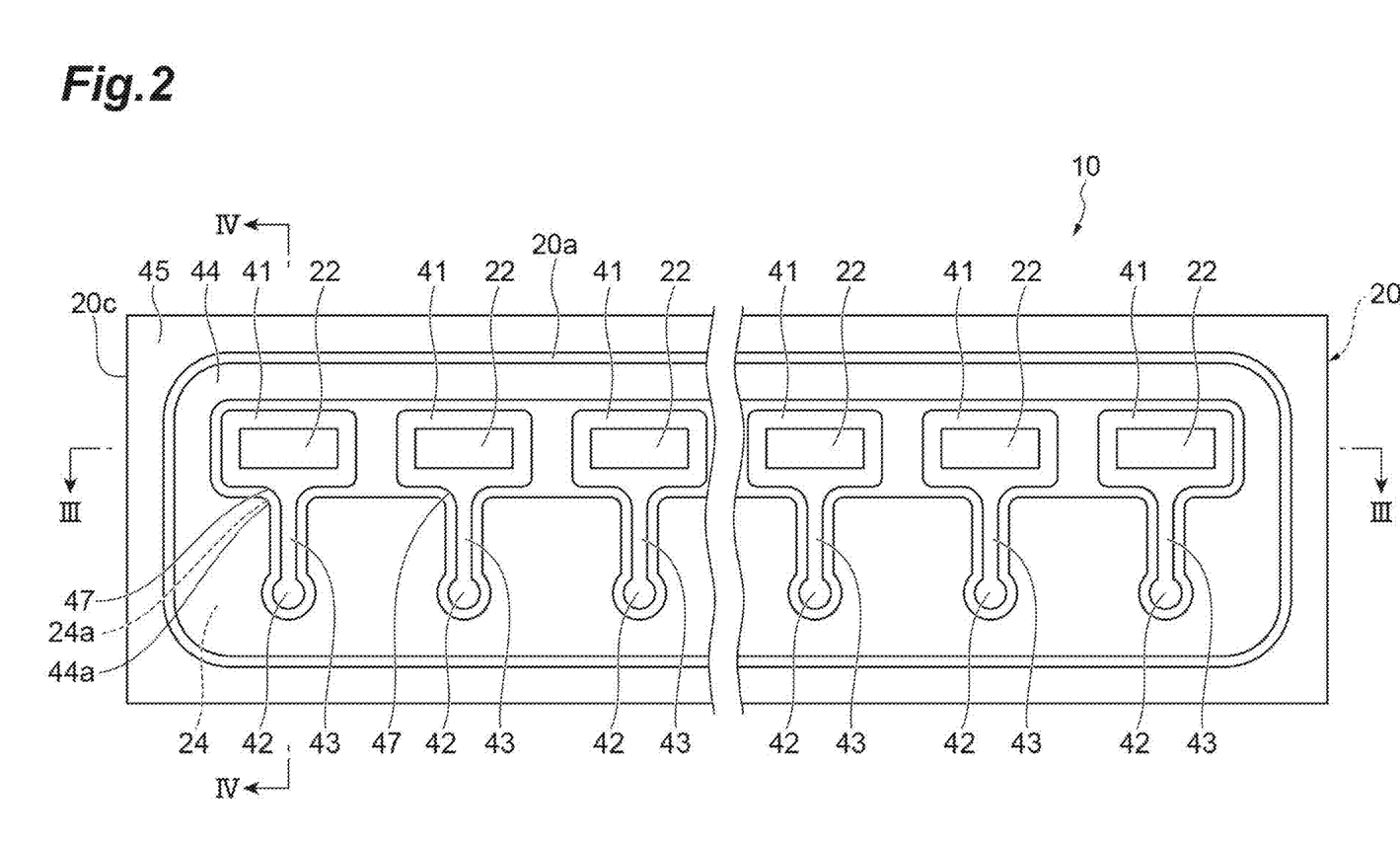
FIG. 2 is a plan view of a light receiving element.
Figure 3:
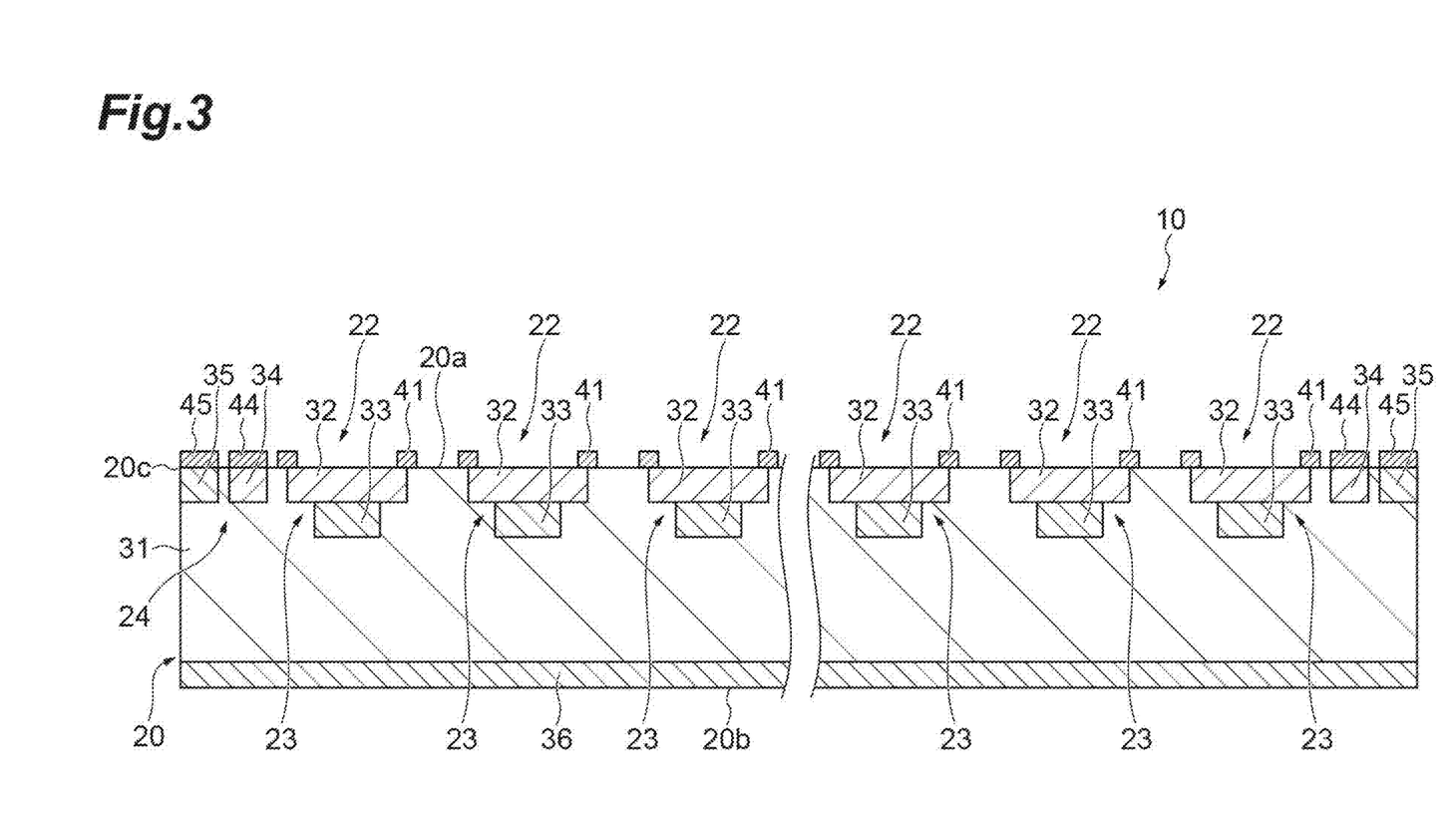
FIG. 3 is a cross-sectional view of the light receiving element.
Figure 4:
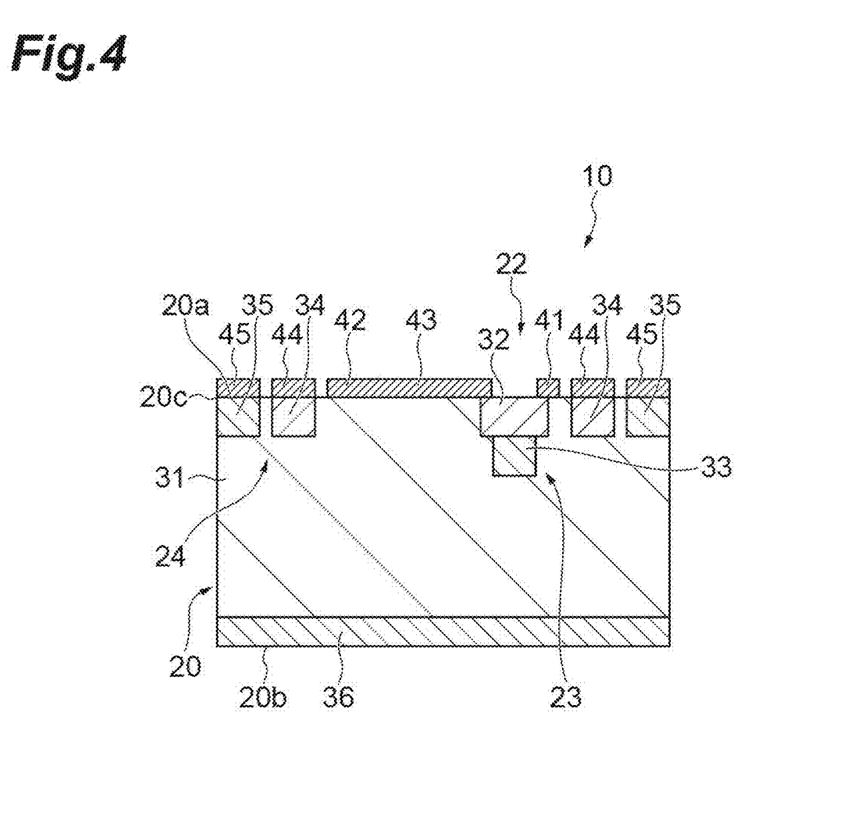
FIG. 4 is a cross-sectional view of the light receiving element.

First, a light detection device according to the present embodiment will be described with reference to FIGS. 1 to 4. FIG. 1 is a plan view of the light detection device according to the present embodiment. FIG. 2 is a plan view of a light receiving element 10. FIG. 3 is a cross-sectional view taken along the line III-III of FIG. 2. FIG. 4 is a cross-sectional view taken along the line IV-IV of FIG. 2.

A light detection device 1 includes the light receiving element 10 and an IC chip 50. The light receiving element 10 and the IC chip 50 are connected to each other through a plurality of wires W provided by wire bonding. As illustrated in FIG. 1, a ball bond is bonded to the light receiving element 10. A ball bond is also bonded to the IC chip 50. In the wire W bonded to the light receiving element 10 and the IC chip 50, a stitch bond is provided at the other end of the ball bond. The stitch bond of the wire W bonded to the light receiving element 10 is electrically connected to the stitch bond of the wire W bonded to the IC chip 50 by the printed wiring provided in the light detection device 1.

The light receiving element 10 includes a semiconductor substrate 20. The semiconductor substrate 20 includes a plurality of cells 22. The plurality of cells 22 are arranged in one direction. Each cell 22 functions as a light receiving portion. Each cell 22 includes at least one avalanche photodiode. Hereinafter, the "avalanche photodiode" will be referred to as an "APD". In the present embodiment, each APD 23 is arranged to operate in linear mode. The APD included in each cell 22 may be arranged to operate in Geiger mode. In the configuration in which the APD 23 is arranged to operate in Geiger mode, a quenching resistor is connected to the APD 23.

Light entering the light detection device 1 is guided to the plurality of cells 22. When light enters each cell 22, photons are converted into electrons and multiplied by the APD 23. The electrons multiplied by the APD 23 are output as a signal. The signal output from each cell 22 is input to the IC chip 50 through the corresponding wire W.

The semiconductor substrate 20 has main surfaces 20a and 20b facing each other. The semiconductor substrate 20 includes a plurality of cells 22 on the main surface 20a side. In the present embodiment, each cell 22 includes one APD 23. Each cell 22 may include a plurality of APDs 23. Each APD 23 may be a reach-through type APD, or may be a reverse type APD. Hereinafter, as an example, the configuration of the semiconductor substrate 20 when each APD 23 is a reach-through type APD will be described.

The semiconductor substrate 20 includes a peripheral carrier absorbing portion 24 in addition to the plurality of cells 22 including the APDs 23. The peripheral carrier absorbing portion 24 surrounds the APD 23. The peripheral carrier absorbing portion 24 is a region configured to absorb carriers located at the periphery.

The semiconductor substrate 20 includes a semiconductor region 31, a plurality of semiconductor layers 32, a plurality of semiconductor layers 33, and semiconductor layers 34, 35, and 36. The APD 23 includes the semiconductor region 31 and the semiconductor layers 32, 33, and 36. The peripheral carrier absorbing portion 24 includes the semiconductor region 31 and the semiconductor layers 34 and 36. The peripheral carrier absorbing portion 24 is configured to absorb carriers located at the periphery in the semiconductor layer 34. That is, the semiconductor layer 34 functions as a peripheral carrier absorption layer that absorbs peripheral carriers.

The semiconductor region 31 and the semiconductor layers 33, 35, and 36 are the first conductive type, and the semiconductor layers 32 and 34 are the second conductive type. Semiconductor impurities are added by, for example, a diffusion method or an ion implantation method. In the present embodiment, the first conductive type is P type and the second conductive type is N type. Assuming that the semiconductor substrate 20 is an Si-based substrate, Group III elements such as B are used as P-type impurities, and Group V elements such as N, P, and As are used as N-type impurities.

The semiconductor region 31 is located on the main surface 20a side of the semiconductor substrate 20. The semiconductor region 31 forms a part of the main surface 20a. The semiconductor region 31 is, for example, P$^-$ type. In the present embodiment, the semiconductor region 31 is a light absorbing region in the APD 23.

Each semiconductor layer 32 forms a part of the main surface 20a. Each semiconductor layer 32 is surrounded by the semiconductor region 31 so as to be in contact with the semiconductor region 31 when viewed from a direction perpendicular to the main surface 20a. Each semiconductor layer 32 forms the APD 23 corresponding thereto. Therefore, the number of the semiconductor layers 32 is equal to the number of the APDs 23. The semiconductor layer 32 is, for example, N$^+$ type. In the present embodiment, the semiconductor layer 32 forms a cathode in the APD 23.

Each semiconductor layer 33 is located between the semiconductor layer 32 and the semiconductor region 31 that correspond thereto. The semiconductor layer 33 is in contact with the semiconductor layer 32 on the main surface 20a side and is in contact with the semiconductor region 31 on the main surface 20b side. Each semiconductor layer 33 forms the APD 23 corresponding thereto. Therefore, the number of the semiconductor layers 33 is equal to the number of the APDs 23. The semiconductor layer 33 has a higher impurity concentration than the semiconductor region 31. The semiconductor layer 33 is, for example, P type. The semiconductor layer 33 forms an avalanche region in the APD 23.

The semiconductor layer 34 forms a part of the main surface 20a. The semiconductor layer 34 is surrounded by the semiconductor region 31 so as to be in contact with the semiconductor region 31 when viewed from the direction perpendicular to the main surface 20a. The semiconductor layer 34 surrounds a plurality of semiconductor layers 32 with the semiconductor region 31 interposed therebetween. As described above, the semiconductor layer 34 forms the peripheral carrier absorbing portion 24. The semiconductor layer 34 is in contact with only the semiconductor region 31 in the semiconductor substrate 20. The peripheral carrier absorbing portion 24 does not include a layer corresponding to the avalanche region. In the present embodiment, the semiconductor layer 34 has the same impurity concentration as the semiconductor layer 32. The semiconductor layer 34 is, for example, N$^+$ type.

The semiconductor layer 35 forms a part of the main surface 20a. The semiconductor layer 35 is in contact with the semiconductor region 31 when viewed from the direction perpendicular to the main surface 20a. The semiconductor layer 35 is provided along the edge 20c of the semiconductor substrate 20. The semiconductor layer 35 surrounds the semiconductor layers 32 and 33 with the semiconductor region 31 interposed therebetween. In the present embodiment, the semiconductor layer 35 has a higher impurity concentration than the semiconductor region 31 and the semiconductor layer 33. The semiconductor layer 35 is, for example, P$^+$ type. The semiconductor layer 35 is connected to the semiconductor layer 36 at a portion that is not illustrated. The semiconductor layer 35 forms anodes of the light detection device 1. The semiconductor layer 35 forms, for example, anodes of the APDs 23 and the peripheral carrier absorbing portion 24.

The semiconductor layer 36 is located closer to the main surface 20b side of the semiconductor substrate 20 than the semiconductor region 31. The semiconductor layer 36 forms the entire main surface 20b. The semiconductor layer 36 is in contact with the semiconductor region 31 on the main surface 20a side. In the present embodiment, the semiconductor layer 36 has a higher impurity concentration than the semiconductor region 31 and the semiconductor layer 33. The semiconductor layer 36 is, for example, P$^+$ type. The semiconductor layer 36 forms anodes of the light detection device 1. The semiconductor layer 36 forms, for example, anodes of the APDs 23 and the peripheral carrier absorbing portion 24.

The light detection device 1 includes a plurality of electrode portions 41, a plurality of pad electrodes 42, a plurality of wiring portions 43, an electrode portion 44, and an electrode portion 45. The plurality of electrode portions 41, the plurality of pad electrodes 42, the plurality of wiring portions 43, the electrode portion 44, and the electrode portion 45 are arranged on the main surface 20a. The plurality of electrode portions 41, the plurality of pad electrodes 42, the plurality of wiring portions 43, the electrode portion 44, and the electrode portion 45 are all formed of a metal, such as aluminum.

Each electrode portion 41 surrounds the cell 22 corresponding thereto when viewed from the direction perpendicular to the main surface 20a. Each electrode portion 41 is connected to the cell 22 corresponding thereto. In the present embodiment, each electrode portion 41 is annular, but is not limited thereto. For example, in the present embodiment, each electrode portion 41 continuously surrounds the cell 22 corresponding thereto, but may intermittently surround the cell 22 corresponding thereto. When each electrode portion 41 continuously surrounds the cell 22 corresponding thereto, each cell 22 is surrounded by the electrode portion 41 configured as one portion. When each electrode portion 41 intermittently surrounds the cell 22 corresponding thereto, each cell 22 is surrounded by the electrode portion 41 configured as a plurality of portions.

At least a part of the cell 22 is exposed from the electrode portion 41. Each electrode portion 41 applies an electric potential to the APD 23 included in the cell 22 corresponding thereto. Each electrode portion 41 is in contact with the semiconductor layer 32 that forms the cell 22 corresponding thereto. In the present embodiment, each electrode portion 41 forms a cathode of the cell 22.

The plurality of pad electrodes 42 are arranged along the arrangement direction of the plurality of cells 22. In the plurality of pad electrodes 42, when viewed from the direction perpendicular to the main surface 20a, the semiconductor region 31 is provided and the semiconductor layer 32 is not provided in a region overlapping the plurality of pad electrodes 42. The plurality of pad electrodes 42 are arranged on the semiconductor region 31 with an insulating film (not illustrated) interposed therebetween. Each pad electrode 42 is circular when viewed from the direction perpendicular to the main surface 20a. Each pad electrode 42 does not have to be circular, and may be, for example, elliptical or rectangular when viewed from the direction perpendicular to the main surface 20a.

The plurality of pad electrodes 42 are spaced apart from the plurality of cells 22 and the plurality of electrode portions 41. The shortest distance between the edge of each cell 22 and the edge of the pad electrode 42 corresponding to the cell 22 is, for example, 50 μm or more. The edge of the cell 22 refers to the boundary between the semiconductor region 31 and the semiconductor layer 32 when viewed from the direction perpendicular to the main surface 20a.

The diameter of each pad electrode 42 is, for example, 100 μm to 120 μm. In the present invention, the diameter of the pad electrode 42 is the minimum distance from edge to edge of the pad electrode 42 on a straight line passing through the position of the center of gravity of the pad electrode 42 in a plan view. Therefore, when the pad electrode 42 is rectangular, the length of the short side is the diameter of the pad electrode 42. The shortest distance between the edge of each cell 22 and the edge of the pad electrode 42 corresponding to the cell 22 is larger than the diameter of the pad electrode 42.

The plurality of wiring portions 43 are arranged along the arrangement direction of the plurality of cells 22. The plurality of wiring portions 43 extend along the main surface 20a in a direction perpendicular to the arrangement direction. Each of the plurality of wiring portions 43 electrically connects the cell 22 and the electrode portion 41 corresponding to each other. The plurality of wiring portions 43 are in contact with the semiconductor region 31. When viewed from the direction perpendicular to the main surface 20a, the semiconductor region 31 is provided and the semiconductor layer 32 is not provided in a region overlapping the plurality of wiring portions 43. The plurality of wiring portions 43 are arranged on the semiconductor region 31 with an insulating film (not illustrated) interposed therebetween. In the present embodiment, the plurality of wiring portions 43 extend in the same direction and in parallel with each other.

One end of each wiring portion 43 is connected to the pad electrode 42. The width of each wiring portion 43 is smaller than the diameter of the pad electrode 42. The width of each wiring portion 43 is, for example, 10 μm to 50 μm. The width of the wiring portion 43 is, for example, the length of the wiring portion 43 in a direction perpendicular to the direction in which the wiring portion 43 extends.

The other end of each wiring portion 43 is connected to the electrode portion 41 corresponding thereto, and is electrically connected to the cell 22 corresponding thereto through the electrode portion 41. In each wiring portion 43, a connection portion 47 between the edge of the electrode portion 41 and the edge of the wiring portion 43 is smoothly curved. The connection portion 47 is curved with a radius of curvature equal to or greater than the thickness of a depletion layer generated when the operating voltage of the APD 23 is applied. That is, the radius of curvature is equal to or greater than the distance between the main surface 20a and the semiconductor layer 36 in the direction perpendicular to the main surface 20a. Therefore, the above radius of curvature is equal to or greater than at least the thickness of a light absorbing region in the thickness direction of the semiconductor substrate 20. In the present embodiment, the light absorbing region is the semiconductor region 31 between the semiconductor layer 33 and the semiconductor layer 36. The connection portion 47 is curved with a radius of curvature of 60 μm to 120 μm, for example.

By applying an electric potential to each pad electrode 42, the electric potential is applied to the cell 22 corresponding thereto through the wiring portion 43 and the electrode portion 41 that are connected to the pad electrode 42. In the present embodiment, each pad electrode 42 is a pad electrode for a cathode. The wire W is connected to the pad electrode 42 by, for example, wire bonding. In the present embodiment, the wire W is connected to the pad electrode 42 by ball bonding. A first bond is formed on the pad electrode 42. Therefore, a ball bond is bonded to the pad electrode 42.

The electrode portion 44 is in contact with the semiconductor layer 34 on the main surface 20a, and covers the semiconductor layer 34. The electrode portion 44 surrounds the plurality of electrode portions 41, the plurality of pad electrodes 42, and the plurality of wiring portions 43 when viewed from the direction perpendicular to the main surface 20a. The electrode portion 44 applies an electric potential to the semiconductor layer 34. The electrode portion 44 is spaced apart from the electrode portion 41, the pad electrode 42, and the electrode portion 45. In the present embodiment, the electrode portion 44 forms a cathode of the peripheral carrier absorbing portion 24.

The electrode portion 44 has an edge 44a facing the connection portion 47 between the edge of the electrode portion 41 and the edge of the wiring portion 43 when viewed from the direction perpendicular to the main surface 20a. The edge 44a is curved. The edge 44a is curved with a radius of curvature equal to or greater than the thickness of a depletion layer generated when the operating voltage of the APD 23 is applied. That is, the radius of curvature is equal to or greater than the distance between the main surface 20a and the semiconductor layer 36 in the direction perpendicular to the main surface 20a. Therefore, the above radius of curvature is equal to or greater than at least the thickness of a light absorbing region in the thickness direction of the semiconductor substrate 20. In the present embodiment, the light absorbing region is the semiconductor region 31 between the semiconductor layer 33 and the semiconductor layer 36. The edge 44a is curved with a radius of curvature of 60 μm to 120 μm, for example.

The electrode portion 45 is in contact with the semiconductor layer 35 on the main surface 20a, and covers the semiconductor layer 35. The electrode portion 45 surrounds the plurality of electrode portions 41, the plurality of pad electrodes 42, and the plurality of wiring portions 43 when viewed from the direction perpendicular to the main surface 20a. The electrode portion 45 applies an electric potential to the semiconductor layer 35. The electrode portion 45 is spaced apart from the electrode portion 41, the pad electrode 42, the wiring portion 43, and the electrode portion 44. In the present embodiment, the electrode portion 45 forms anodes of the light detection device 1.

In the light detection device 1, as described above, the semiconductor layer 34 forming the peripheral carrier absorbing portion 24 is covered with the electrode portion 44. The electrode portion 44 is electrically connected to the peripheral carrier absorbing portion 24. The edge of the semiconductor layer 34 is arranged along the edge 44a of the electrode portion 44. Therefore, the peripheral carrier absorbing portion 24 including the semiconductor layer 34 is arranged in a region where the electrode portion 44 is arranged when viewed from the direction perpendicular to the main surface 20a. As illustrated in FIG. 3, the peripheral carrier absorbing portion 24 is provided around the plurality of pad electrodes 42 and the plurality of wiring portions 43 when viewed from the direction perpendicular to the main surface 20a.

In the present embodiment, the peripheral carrier absorbing portion 24 completely surrounds the plurality of electrode portions 41, the plurality of pad electrodes 42, and the plurality of wiring portions 43 when viewed from the direction perpendicular to the main surface 20a. In other words, the peripheral carrier absorbing portion 24 surrounds the plurality of electrode portions 41, the plurality of pad electrodes 42, and the plurality of wiring portions 43 continuously rather than intermittently. When the peripheral carrier absorbing portion 24 continuously surrounds the plurality of electrode portions 41, the plurality of pad electrodes 42, and the plurality of wiring portions 43, the peripheral carrier absorbing portion 24 may be configured as one portion.

In the present embodiment, the peripheral carrier absorbing portions 24 are provided along the edges of each pad electrode 42 and each wiring portion 43 at predetermined distances with respect to these edges. The peripheral carrier absorbing portion 24 protrudes toward the wiring portion 43 in a direction parallel to the main surface 20a and perpendicular to the extending direction of the wiring portion 43.

The peripheral carrier absorbing portion 24 surrounds each wiring portion 43 so that the distance between the edge of the peripheral carrier absorbing portion 24 and the edge of each wiring portion 43 is, for example, 25 µm to 50 µm when viewed from the direction perpendicular to the main surface 20a. Similarly, the peripheral carrier absorbing portion 24 surrounds each pad electrode 42 so that the distance between the edge of the peripheral carrier absorbing portion 24 and the edge of each pad electrode 42 is, for example, 25 µm to 50 µm when viewed from the direction perpendicular to the main surface 20a.

The peripheral carrier absorbing portion 24 has an edge 24a facing the connection portion 47 between the edge of the electrode portion 41 and the edge of the wiring portion 43 when viewed from the direction perpendicular to the main surface 20a. The edge 24a is curved. The edge 24a is curved with a radius of curvature equal to or greater than the thickness of a depletion layer generated when the operating voltage of the APD 23 is applied. That is, the radius of curvature is equal to or greater than the distance between the main surface 20a and the semiconductor layer 36 in the direction perpendicular to the main surface 20a. Therefore, the above radius of curvature is equal to or greater than at least the thickness of a light absorbing region in the thickness direction of the semiconductor substrate 20. In the present embodiment, the light absorbing region is the semiconductor region 31 between the semiconductor layer 33 and the semiconductor layer 36. The edge 24a is curved with a radius of curvature of 60 µm to 120 µm, for example. The edge 24a of the peripheral carrier absorbing portion 24 is arranged along the edge 44a of the electrode portion 44.

Figure 5:
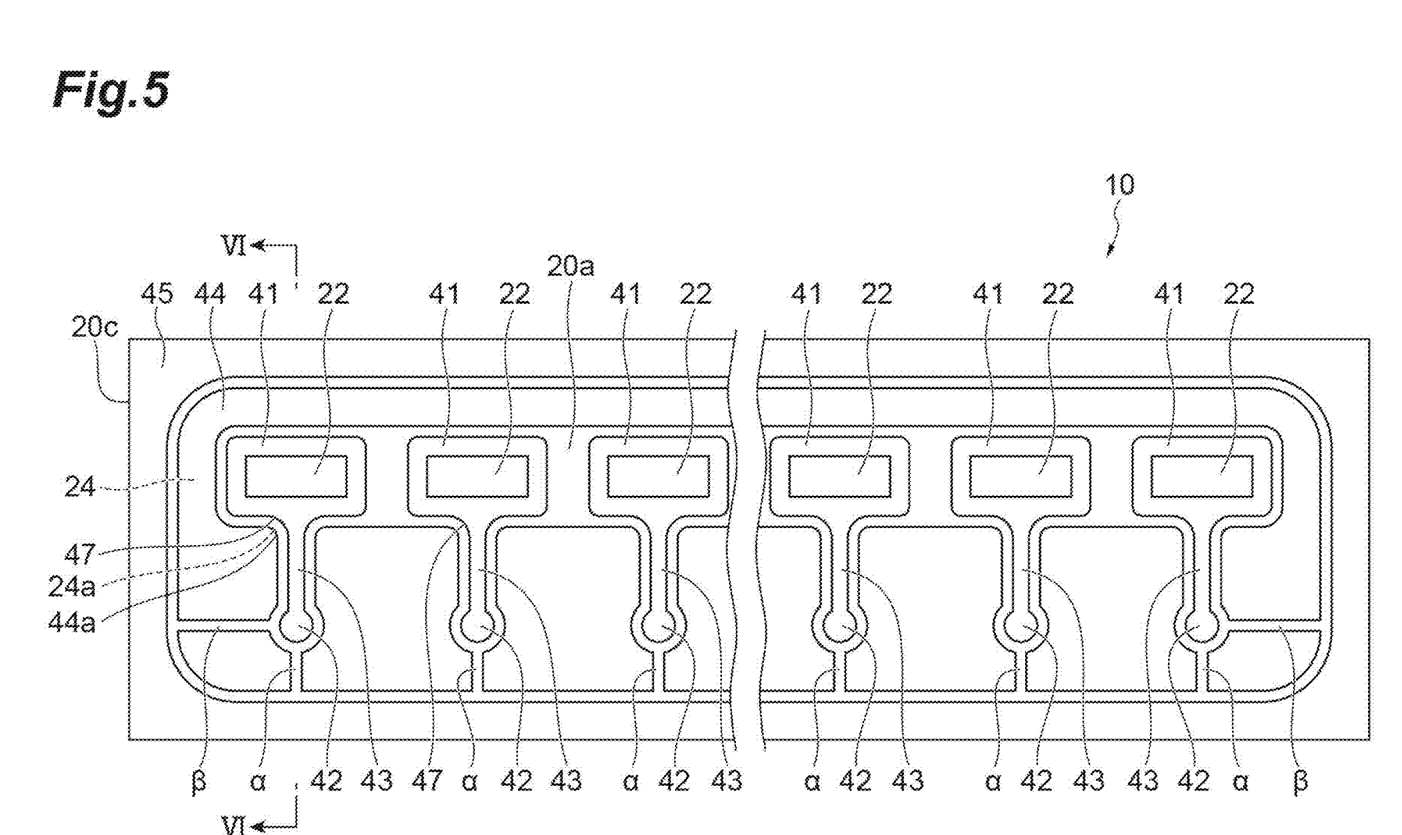
FIG. 5 is a plan view of a light receiving element according to a modification example of the present embodiment.
Figure 6:
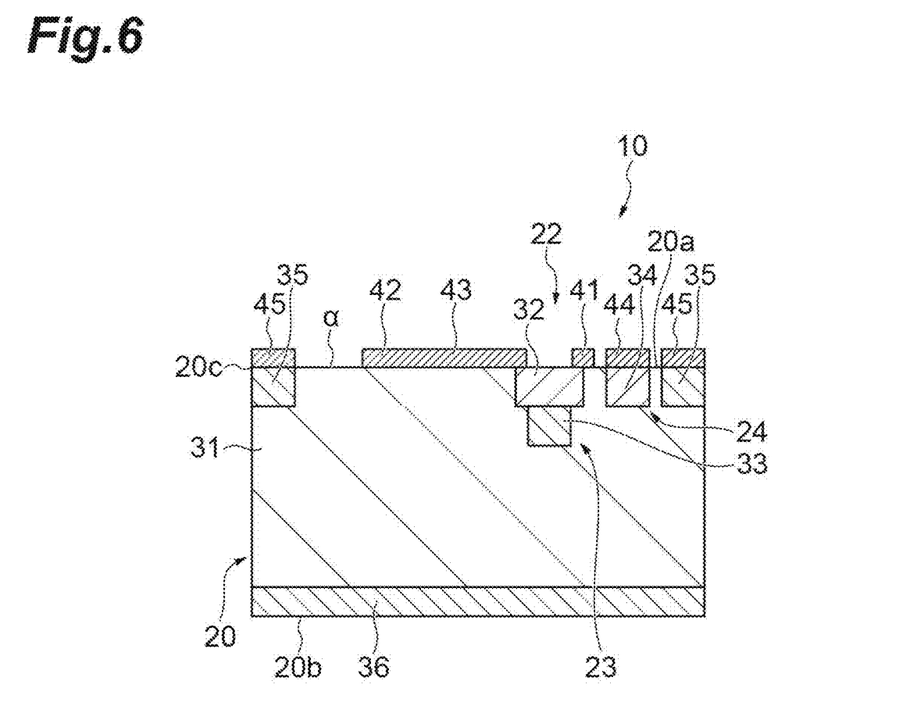
FIG. 6 is a cross-sectional view of the light receiving element according to the modification example of the present embodiment.

Next, a light detection device according to a modification example of the present embodiment will be described with reference to FIGS. 5 and 6. FIG. 5 is a plan view of the light receiving element 10. FIG. 6 is a cross-sectional view taken along the line VI-VI of FIG. 5. This modification example is generally similar to or the same as the above-described embodiment. This modification example is different from the above-described embodiment in that the peripheral carrier absorbing portion 24 intermittently surrounds the plurality of electrode portions 41, the plurality of pad electrodes 42, and the plurality of wiring portions 43. Hereinafter, the differences between the above-described embodiment and the modification example will be mainly described.

As illustrated in FIG. 5, also in this modification example, the peripheral carrier absorbing portion 24 is provided around the plurality of pad electrodes 42 and the plurality of wiring portions 43 when viewed from the direction perpendicular to the main surface 20a. However, in this modification example, the peripheral carrier absorbing portion 24 intermittently surrounds the plurality of electrode portions 41, the plurality of pad electrodes 42, and the plurality of wiring portions 43 when viewed from the direction perpendicular to the main surface 20a. When the peripheral carrier absorbing portion 24 intermittently surrounds the cell 22 corresponding thereto, the peripheral carrier absorbing portion 24 is configured as a plurality of portions. In this modification example, the peripheral carrier absorbing portion 24 is divided at a portion surrounding each pad electrode 42. In this modification example, the peripheral carrier absorbing portion 24 is divided into a plurality of regions.

In the extending direction of each wiring portion 43, the peripheral carrier absorbing portion 24 is not provided in a region α between the pad electrode 42 and the electrode portion 45. In the region α, the semiconductor region 31 is exposed. Therefore, the exposed portion of the semiconductor region 31 extends from each pad electrode 42 to the electrode portion 45, which is closest to the pad electrode 42, in a direction perpendicular to the arrangement direction of the plurality of pad electrodes 42.

In the arrangement direction of the plurality of pad electrodes 42, the peripheral carrier absorbing portion 24 is not provided in a region β between the pad electrode 42 located at the end and the electrode portion 45. In the region β, the semiconductor region 31 is exposed. Therefore, the exposed portion of the semiconductor region 31 extends from the pad electrode 42 located at the end to the electrode portion 45, which is closest to the pad electrode 42, in the arrangement direction of the plurality of pad electrodes 42.

Next, the operational effects of the light detection devices in the above-described embodiment and modification example will be described. When a pad electrode is arranged around the cell 22, light is reflected by the wire W connected to the pad electrode, and noise due to stray light may affect the detection result. A ball bond has a wide area for reflecting light. Therefore, for example, when the ball bond is bonded to the pad electrode around the cell 22 by ball bonding, it is easier for the stray light to enter the cell 22. In the light detection device 1, the cell 22 and the pad electrode 42 corresponding to each other are arranged apart from each other and are connected to each other by the wiring portion 43. For this reason, it is not likely that the stray light reflected by the wire connected to the pad electrode 42 enters the cell 22.

Since a relatively high voltage is applied to the APD 23, the concentration of electrons or holes in a portion of the semiconductor substrate 20 in contact with the pad electrode 42 may change.

Similarly, the concentration of electrons or holes in a portion of the semiconductor substrate 20 in contact with the wiring portion 43 may change. In this case, carriers may be generated in the above portion due to the light entering the portion. When carriers are generated in this portion, noise is detected as a detection result. In the light detection device 1, the peripheral carrier absorbing portion 24 is provided around each wiring portion 43. Therefore, even if unnecessary carriers are generated in the above portion, the generated carriers are absorbed by the peripheral carrier absorbing portion 24. Therefore, in the light detection device 1, the accuracy of light detection is improved.

The width of each wiring portion 43 is smaller than the diameter of each pad electrode 42. In this case, a portion where the semiconductor substrate 20 and the wiring portion 43 are in contact with each other is small. Therefore, it is possible to suppress a change in the concentration of electrons or holes in the semiconductor substrate 20 that occurs due to the voltage applied to the wiring portion 43.

The shortest distance between the edge of each cell 22 and the edge of the pad electrode 42 corresponding to the cell 22 is larger than the diameter of the pad electrode 42. In this case, it is less likely that the light reflected by the wire connected to the pad electrode 42 enters the cell 22.

The shortest distance between the edge of each cell 22 and the edge of the pad electrode 42 corresponding to the cell 22 is 50 μm or more. In this case, it is less likely that the light reflected by the wire connected to the pad electrode 42 enters the cell 22.

The peripheral carrier absorbing portion 24 surrounds each wiring portion 43 so that the distance between the edge of the peripheral carrier absorbing portion 24 and the edge of each wiring portion 43 is 25 μm to 50 μm. When the distance is 25 μm or more, a short circuit between the peripheral carrier absorbing portion 24 and the wiring portion 43 is further suppressed. When the above distance is 50 μm or less, unnecessary carriers are further absorbed by the peripheral carrier absorbing portion 24.

A plurality of the electrode portions 41 are arranged on the main surface 20a and are each connected to each cell 22. Each of the plurality of wiring portions 43 is connected to the electrode portion 41 connected to the cell 22 corresponding thereto. The connection portion 47 between the edge of the electrode portion 41 and the edge of the wiring portion 43 is curved. The radius of curvature of the connection portion 47 is equal to or greater than the thickness of a depletion layer of the APD 23 in the thickness direction of the semiconductor substrate 20. In this case, the concentration of the electric field at the above connection portion 47 is suppressed. ESD resistance is also improved.

The APD 23 includes a light absorbing region that is the semiconductor region 31. The radius of curvature of the connection portion 47 is larger than the thickness of the light absorbing region in the thickness direction of the semiconductor substrate 20. In this case, the concentration of the electric field at the above connection portion 47 is suppressed. ESD resistance is also improved.

The connection portion 47 between the edge of the electrode portion 41 and the edge of the wiring portion 43 is curved with a radius of curvature of 60 μm to 120 μm. In this case, the concentration of the electric field at the above connection portion 47 is suppressed. ESD resistance is also improved.

The light detection device 1 further includes a plurality of wires each connected to each pad electrode 42. A ball bond of the wire is bonded to each pad electrode 42. In this case, the size of the pad electrode 42 can be reduced. Damage caused to the semiconductor substrate 20 in wire bonding is reduced. However, the ball bond has a wider area for reflecting light than the stitch bond. Since the ball bond is formed in a ball shape, the light reflected by the ball bond is more likely to travel toward the semiconductor substrate than the light reflected by the stitch bond. Therefore, as described above, when the ball bond is bonded to the pad electrode around the cell 22 by ball bonding, it is easier for the stray light to enter the cell 22 than when the stitch bond is bonded to the pad electrode 42. As the amount of stray light entering the cell 22 increases, the amount of noise appearing in the detection result also increases. In the light detection device 1, the cell 22 and the pad electrode 42 are arranged apart from each other and are connected to each other by the wiring portion 43. For this reason, even if the ball bond is bonded to the pad electrode 42, it is not likely that the stray light reflected by the ball bond enters the cell 22. Therefore, the reduction of the pad electrode 42, the reduction of damage caused to the semiconductor substrate 20 in wire bonding, and the reduction of noise due to stray light are achieved at the same time.

While the embodiment of the present invention and the modification example have been described above, the present invention is not necessarily limited to the above-described embodiment and modification example, and various changes can be made without departing from the scope of the present invention.

For example, the peripheral carrier absorbing portion 24 may separately surround the plurality of APDs 23. In other words, the peripheral carrier absorbing portion 24 may surround the plurality of APDs one by one.

REFERENCE SIGNS LIST

1: light detection device, 20: semiconductor substrate, 20a, 20b: main surface, 22: cell, 23: APD, 24: peripheral carrier absorbing portion, 24a, 44a: edge, 41: electrode portion, 42: pad electrode, 43: wiring portion, 47: connection portion, W: wire.

The invention claimed is:
1. A light detection device, comprising:
a semiconductor substrate that has first and second main surfaces facing each other and includes a plurality of cells each including at least one avalanche photodiode;
a plurality of pad electrodes arranged on the first main surface so as to be spaced apart from the plurality of cells;
a plurality of wiring portions that are arranged on the first main surface and electrically connect the cells and the pad electrodes, each of the wiring portions electrically connecting the cell and the pad electrode corresponding to each other; and
a plurality of electrode portions each connected to each of the cells,
wherein the avalanche photodiode includes a light absorbing region,
each of the plurality of wiring portions is connected to the electrode portion connected to the cell corresponding thereto,
a connection portion between an edge of the electrode portion and an edge of the wiring portion is curved,
a radius of curvature of the connection portion is equal to or greater than a thickness of the light absorbing region in a thickness direction of the semiconductor substrate,
the semiconductor substrate includes a peripheral carrier absorbing portion configured to absorb carriers located at a periphery of the peripheral carrier absorbing portion, and
the peripheral carrier absorbing portion is provided around each of the pad electrodes and each of the wiring portions when viewed from a direction perpendicular to the first main surface.
2. The light detection device according to claim 1, wherein the peripheral carrier absorbing portion continuously surrounds each of the pad electrodes and each of the wiring portions.

3. The light detection device according to claim 1,
wherein the peripheral carrier absorbing portion intermittently surrounds each of the pad electrodes and each of the wiring portions.

4. The light detection device according to claim 1,
wherein a width of each of the wiring portions is smaller than a diameter of each of the pad electrodes.

5. The light detection device according to claim 1,
wherein a shortest distance between an edge of each of the cells and an edge of the pad electrode corresponding to the cell is larger than a diameter of the pad electrode.

6. The light detection device according to claim 1,
wherein a shortest distance between an edge of each of the cells and an edge of the pad electrode corresponding to the cell is 50 μm or more.

7. The light detection device according to claim 1,
wherein the peripheral carrier absorbing portion surrounds each of the wiring portions so that a distance between an edge of the peripheral carrier absorbing portion and an edge of each of the wiring portions is 25 μm to 50 μm.

8. A The light detection device, according to claim 1, further comprising:
a semiconductor substrate that has first and second main surfaces facing each other and includes a plurality of cells each including at least one avalanche photodiode;
a plurality of pad electrodes arranged on the first main surface so as to be spaced apart from the plurality of cells;
a plurality of wiring portions that are arranged on the first main surface and electrically connect the cells and the pad electrodes, each of the wiring portions electrically connecting the cell and the pad electrode corresponding to each other; and
a plurality of electrode portions each connected to each of the cells,
wherein each of the plurality of wiring portions is connected to the electrode portion connected to the cell corresponding thereto,
a connection portion between an edge of the electrode portion and an edge of the wiring portion is curved,
a radius of curvature of the connection portion is equal to or greater than a thickness of a depletion layer of the avalanche photodiode in a thickness direction of the semiconductor substrate,
the semiconductor substrate includes a peripheral carrier absorbing portion configured to absorb carriers located at a periphery of the peripheral carrier absorbing portion, and
the peripheral carrier absorbing portion is provided around each of the pad electrodes and each of the wiring portions when viewed from a direction perpendicular to the first main surface.

9. A light detection device, comprising:
a semiconductor substrate that has first and second main surfaces facing each other and includes a plurality of cells each including at least one avalanche photodiode;
a plurality of pad electrodes arranged on the first main surface so as to be spaced apart from the plurality of cells;
a plurality of wiring portions that are arranged on the first main surface and electrically connect the cells and the pad electrodes, each of the wiring portions electrically connecting the cell and the pad electrode corresponding to each other; and
a plurality of electrode portions each connected to each of the cells,
wherein each of the plurality of wiring portions is connected to the electrode portion connected to the cell corresponding thereto,
the semiconductor substrate includes a peripheral carrier absorbing portion configured to absorb carriers located at a periphery of the peripheral carrier absorbing portion, and
the peripheral carrier absorbing portion is provided around each of the pad electrodes and each of the wiring portions when viewed from a direction perpendicular to the first main surface,
the peripheral carrier absorbing portion has a curved edge facing a connection portion between an edge of the electrode portion and an edge of the wiring portion when viewed from the direction perpendicular to the first main surface, and
a radius of curvature of the edge of the peripheral carrier absorbing portion is equal to or greater than a thickness of a depletion layer of the avalanche photodiode in a thickness direction of the semiconductor substrate.

10. The light detection device according to claim 8,
wherein the peripheral carrier absorbing portion has a curved edge facing a connection portion between an edge of the electrode portion and an edge of the wiring portion when viewed from the direction perpendicular to the first main surface, and
a radius of curvature of the edge of the peripheral carrier absorbing portion is equal to or greater than a thickness of a depletion layer of the avalanche photodiode in a thickness direction of the semiconductor substrate.

11. A light detection device, comprising:
a semiconductor substrate that has first and second main surfaces facing each other and includes a plurality of cells each including at least one avalanche photodiode;
a plurality of pad electrodes arranged on the first main surface so as to be spaced apart from the plurality of cells;
a plurality of wiring portions that are arranged on the first main surface and electrically connect the cells and the pad electrodes, each of the wiring portions electrically connecting the cell and the pad electrode corresponding to each other; and
a plurality of electrode portions each connected to each of the cells,
wherein the avalanche photodiode includes a light absorbing region,
each of the plurality of wiring portions is connected to the electrode portion connected to the cell corresponding thereto,
the semiconductor substrate includes a peripheral carrier absorbing portion configured to absorb carriers located at a periphery of the peripheral carrier absorbing portion, and
the peripheral carrier absorbing portion is provided around each of the pad electrodes and each of the wiring portions when viewed from a direction perpendicular to the first main surface,
the peripheral carrier absorbing portion has a curved edge facing a connection portion between an edge of the electrode portion and an edge of the wiring portion when viewed from the direction perpendicular to the first main surface, and
a radius of curvature of the edge of the peripheral carrier absorbing portion is equal to or greater than a thickness of the light absorbing region in a thickness direction of the semiconductor substrate.

12. The light detection device according to claim 1,
wherein the peripheral carrier absorbing portion has a curved edge facing a connection portion between an edge of the electrode portion and an edge of the wiring portion when viewed from the direction perpendicular to the first main surface, and
a radius of curvature of the edge of the peripheral carrier absorbing portion is equal to or greater than a thickness of the light absorbing region in a thickness direction of the semiconductor substrate.

13. The light detection device according to claim 1,
wherein the connection portion between the edge of the electrode portion and the edge of the wiring portion is curved with a radius of curvature of 60 μm to 120 μm.

14. The light detection device according to claim 1,
wherein the edge of the peripheral carrier absorbing portion is curved with a radius of curvature of 60 μm to 120 μm.

15. The light detection device according to claim 1, further comprising:
a plurality of wires each connected to each of the pad electrodes,
wherein a ball bond of the wire is bonded to each of the pad electrodes.

16. The light detection device according to claim 8, further comprising:
a plurality of wires each connected to each of the pad electrodes,
wherein a ball bond of the wire is bonded to each of the pad electrodes.

17. The light detection device according to claim 9, further comprising:
a plurality of wires each connected to each of the pad electrodes,
wherein a ball bond of the wire is bonded to each of the pad electrodes.

18. The light detection device according to claim 11,
wherein the peripheral carrier absorbing portion continuously surrounds each of the pad electrodes and each of the wiring portions.

19. The light detection device according to claim 11,
wherein the peripheral carrier absorbing portion intermittently surrounds each of the pad electrodes and each of the wiring portions.

20. The light detection device according to claim 11,
wherein a width of each of the wiring portions is smaller than a diameter of each of the pad electrodes.

21. The light detection device according to claim 11,
wherein a shortest distance between an edge of each of the cells and an edge of the pad electrode corresponding to the cell is larger than a diameter of the pad electrode.

22. The light detection device according to claim 11,
wherein a shortest distance between an edge of each of the cells and an edge of the pad electrode corresponding to the cell is 50 μm or more.

23. The light detection device according to claim 11,
wherein the peripheral carrier absorbing portion surrounds each of the wiring portions so that a distance between an edge of the peripheral carrier absorbing portion and an edge of each of the wiring portions is 25 μm to 50 μm.

24. The light detection device according to claim 11,
wherein the edge of the peripheral carrier absorbing portion is curved with a radius of curvature of 60 μm to 120 μm.

25. The light detection device according to claim 11, further comprising:
a plurality of wires each connected to each of the pad electrodes,
wherein a ball bond of the wire is bonded to each of the pad electrodes.

* * * * *